United States Patent
Cai

(10) Patent No.: US 10,348,013 B2
(45) Date of Patent: Jul. 9, 2019

(54) CARD TRAY, METHOD FOR PREPARING CARD TRAY, AND MOBILE TERMINAL

(71) Applicant: HUAWEI TECHNOLOGIES CO., LTD., Shenzhen, Guangdong (CN)

(72) Inventor: Ming Cai, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/872,989

(22) Filed: Jan. 17, 2018

(65) Prior Publication Data

US 2018/0145433 A1    May 24, 2018

Related U.S. Application Data

(63) Continuation of application No. PCT/CN2016/076363, filed on Mar. 15, 2016.

(30) Foreign Application Priority Data

Jul. 17, 2015   (CN) .......................... 2015 1 0425471

(51) Int. Cl.
*H04B 1/3818* (2015.01)
*H01R 12/71* (2011.01)
(Continued)

(52) U.S. Cl.
CPC ............. *H01R 12/71* (2013.01); *C23C 14/06* (2013.01); *C23C 16/26* (2013.01); *H01R 13/518* (2013.01);
(Continued)

(58) Field of Classification Search
CPC ....... H04B 1/3818; C23C 14/06; C23C 16/26; C23C 16/27; H01R 12/71; H01R 12/518;
(Continued)

(56) References Cited

U.S. PATENT DOCUMENTS 6,220,327 B1 *   4/2001   Rothwell ................. B41J 3/283
                                                        156/256
8,530,051 B2 *   9/2013   Yamaguchi ......... C23C 14/0605
                                                        192/110 R
(Continued)

FOREIGN PATENT DOCUMENTS

CN         101257155 A      9/2008
CN         202049771 U     11/2011
(Continued)

*Primary Examiner* — Harshad C Patel
(74) *Attorney, Agent, or Firm* — Huawei Technologies Co., Ltd.

(57) ABSTRACT

A card tray for holding a card in a mobile terminal, a method for preparing the card tray, and a mobile terminal are disclosed. The card tray includes a card tray base, a first insulation layer disposed on the card tray base, and a second insulation layer covering the first insulation layer. Hardness of the first insulation layer is higher than hardness of the second insulation layer. When inserting a card to a mobile terminal, burrs or sharp parts on the card may pierce the second insulation layer, whereas the first insulation layer can block the burrs or the sharp parts, preventing an insulation coating on the card tray base from being scratched.

20 Claims, 3 Drawing Sheets

(51) Int. Cl.
*H01R 13/629* (2006.01)
*H04M 1/02* (2006.01)
*H04B 1/3816* (2015.01)
*C23C 14/06* (2006.01)
*C23C 16/26* (2006.01)
*H01R 13/518* (2006.01)

(52) U.S. Cl.
CPC ......... *H01R 13/629* (2013.01); *H04B 1/3816* (2013.01); *H04B 1/3818* (2015.01); *H04M 1/02* (2013.01)

(58) Field of Classification Search
CPC ...... H01R 13/629; H01R 12/89; H01R 33/76; H01R 9/2466; H01R 4/2425
USPC ........ 439/630; 361/679.31, 679–32, 679–33, 361/679.37, 679.38, 679.39, 679.4, 361/679.41
See application file for complete search history.

(56) References Cited

U.S. PATENT DOCUMENTS

| | | | | |
|---|---|---|---|---|
| 8,609,992 | B2* | 12/2013 | Chiyonaga | G11B 5/4833 174/254 |
| 2008/0165508 | A1* | 7/2008 | Wang | H04M 1/026 361/728 |
| 2010/0099283 | A1* | 4/2010 | Wu | G06K 13/08 439/153 |
| 2013/0314854 | A1* | 11/2013 | Chung | H05K 5/0239 361/679.01 |
| 2014/0075074 | A1* | 3/2014 | Lee | H04B 1/3818 710/302 |
| 2014/0113495 | A1* | 4/2014 | Lim | H01R 27/00 439/630 |
| 2014/0274209 | A1* | 9/2014 | Sutherland | H04M 1/026 455/558 |
| 2014/0301049 | A1* | 10/2014 | Wu | G06K 13/08 361/756 |
| 2015/0022981 | A1* | 1/2015 | Tan | G06K 7/0021 361/756 |
| 2015/0245473 | A1* | 8/2015 | Shimizu | H05K 1/0298 257/778 |

FOREIGN PATENT DOCUMENTS

| | | |
|---|---|---|
| CN | 202736530 U | 2/2013 |
| CN | 102953043 A | 3/2013 |
| CN | 103812975 A | 5/2014 |
| CN | 203882647 U | 10/2014 |
| CN | 204442439 U | 7/2015 |
| JP | H10188514 A | 7/1998 |
| WO | 2005043826 A1 | 5/2005 |

* cited by examiner

CARD TRAY, METHOD FOR PREPARING CARD TRAY, AND MOBILE TERMINAL

CROSS-REFERENCE TO RELATED APPLICATIONS

This application is a continuation of International Application No. PCT/CN2016/076363, filed on Mar. 15, 2016, which claims priority to Chinese Patent Application No. 201510425471.1, filed on Jul. 17, 2015. The disclosures of the aforementioned applications are hereby incorporated by reference in their entireties.

TECHNICAL FIELD

The present application relates to the field of communications device technologies, and in particular, to a card tray, a method for preparing a card tray, and a mobile terminal.

BACKGROUND

Nowadays, smartphone technologies are developing rapidly. One of causes that may affect signals of a smartphone is that if surface insulation coating of a card tray (or referred to as a card slot) is damaged, the card tray becomes electrically conductive. As a result, communication signals of the mobile phone are affected, leading to poor signal quality or even that the mobile phone cannot recognize a subscriber identity module (SIM) card.

SUMMARY

The present application provides a card tray, a method for preparing a card tray, and a mobile terminal to improve an insulation effect of the card tray and improve an effect of recognizing a card by the mobile terminal.

According to a first aspect, a card tray is provided, where the card tray includes a card tray base, a first insulation layer disposed on the card tray base, and a second insulation layer covering the first insulation layer, where hardness of the first insulation layer is higher than that of the second insulation layer.

With reference to the first aspect, in a first possible implementation, the first insulation layer is an insulation coating including a diamond-like carbon material.

With reference to the first aspect or the first possible implementation of the first aspect, in a second possible implementation, the first insulation layer includes a metal base layer disposed on the card tray base, an intermediate layer disposed on the metal base layer, and an insulation coating disposed on the intermediate layer, where the intermediate layer is a mixed layer of a metal and a chemical compound of the metal, and the insulation coating is a mixed layer of a metal, a chemical compound of the metal, and a diamond-like carbon material.

With reference to the second possible implementation of the first aspect, in a third possible implementation, in the insulation coating, content of the metal and the chemical compound of the metal is higher in a position closer to the intermediate layer; and content of the diamond-like carbon material is higher in a position farther away from the intermediate layer.

With reference to the second possible implementation of the first aspect, in a fourth possible implementation, the chemical compound of the metal in the mixed layer of the metal and the chemical compound of the metal may be a metal oxide, a metal nitride, a metal carbide, a metal sulfide, a metal boride, a metal oxynitride, a metal carbonitride, or a metal carbon oxynitride.

With reference to the first aspect, in a fifth possible implementation, a material of the card tray base includes at least one of the following materials:
a metal material, a metal alloy material, a metal base composite material, or an inorganic non-metal material.

With reference to the first aspect, in a sixth possible implementation, a thickness of the first insulation layer is between 0.3 micrometer and 7 micrometers.

With reference to the sixth possible implementation of the first aspect, in a seventh possible implementation, a thickness of the second insulation layer is between 3 micrometers and 100 micrometers.

With reference to the first aspect, in an eighth possible implementation, a thickness of the first insulation layer is between 0.3 micrometer and 3 micrometers.

With reference to the eighth possible implementation of the first aspect, in a ninth possible implementation, a thickness of the second insulation layer is between 10 micrometers and 25 micrometers.

With reference to the first aspect, the first possible implementation of the first aspect, the second possible implementation of the first aspect, the third possible implementation of the first aspect, the fourth possible implementation of the first aspect, the fifth possible implementation of the first aspect, the sixth possible implementation of the first aspect, the seventh possible implementation of the first aspect, the eighth possible implementation of the first aspect, or the ninth possible implementation of the first aspect, in a tenth possible implementation, the second insulation layer is a polymer coating.

With reference to the tenth possible implementation of the first aspect, in an eleventh possible implementation, a material of the second insulation layer includes at least one of the following materials:
a polytetrafluoroethylene coating, a paint coating, or an ink coating.

According to a second aspect, a method for preparing a card tray is provided, where the method includes the following steps:
forming a first insulation layer on a card tray base; and
forming a second insulation layer on the formed first insulation layer, where hardness of the formed first insulation layer is higher than that of the second insulation layer.

With reference to the second aspect, in a first possible implementation, the forming a first insulation layer on a card tray base specifically includes:
forming a metal base layer on the card tray base;
forming an intermediate layer on the metal base layer; and
forming an insulation coating on the intermediate layer, where the intermediate layer is a mixed layer of a metal and a chemical compound of the metal, and the insulation coating is a mixed layer of a metal, a chemical compound of the metal, and a diamond-like carbon material.

With reference to the first possible implementation of the second aspect, in a second possible implementation, as a thickness of the intermediate layer increases, content of the metal in the intermediate layer decreases gradually, and as the thickness of the intermediate layer increases, content of the chemical compound of the metal in the intermediate layer increases gradually.

With reference to the second possible implementation of the second aspect, in a third possible implementation, as a thickness of the insulation coating increases, content of the metal and the chemical compound of the metal in the insulation coating decreases gradually, and as the thickness of the insulation coating increases, content of a diamond-like carbon film in the insulation coating increases gradually.

With reference to the first aspect, the first possible implementation of the second aspect, the second possible implementation of the second aspect, or the third possible implementation of the second aspect, in a fourth possible implementation, the method further includes: before the forming a first insulation layer on a card tray base, performing ion cleaning on the card tray base in a vacuum state.

With reference to the fourth possible implementation of the second aspect, in a fifth possible implementation, the method further includes: after the forming a second insulation layer on the formed first insulation layer, baking the second insulation layer at a high temperature.

With reference to the fourth possible implementation of the second aspect, in a sixth possible implementation, a thickness of the formed first insulation layer is between 0.3 micrometer and 7 micrometers, and a thickness of the formed second insulation layer is between 3 micrometers and 100 micrometers.

According to a third aspect, a mobile terminal is provided, where the mobile terminal includes a mobile terminal body, a card tray disposed inside the mobile terminal body, and a card clamped into the card tray, where the card tray is any one of the foregoing card trays.

According to the card tray provided by the first aspect, the method for preparing a card tray provided by the second aspect, and the mobile terminal provided by the third aspect, two insulation layers are disposed on a card tray base to protect the card tray base, and hardness of a first insulation layer is set to be higher than that of a second insulation layer. When burrs or sharp parts on a card pierce the second insulation layer, the first insulation layer can block the burrs or the sharp parts, thereby preventing an insulation coating on the card tray base from being scratched by the burrs. Therefore, insulating properties of the card tray are improved effectively, and further, an effect of recognizing the card by the mobile terminal is improved; and cases in which the mobile terminal cannot recognize the card due to scratches on the insulation coating of the card tray and electric conduction of the card tray are reduced effectively.

REFERENCE SIGNS IN THE DRAWINGS

Figure 1:
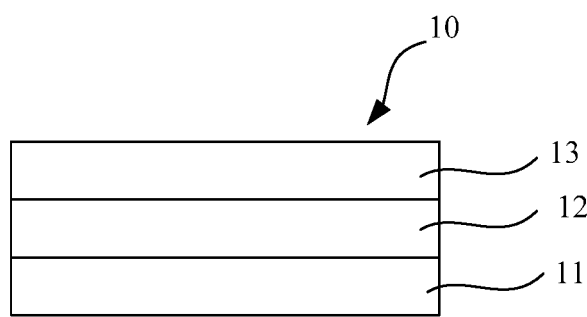
FIG. 1 is a cross sectional view of a card tray according to an embodiment of the present application.

10: Card tray
11: Card tray base
12: First insulation layer
121: Metal base layer
122: Intermediate layer
123: Insulation coating
13: Second insulation layer
20: Mobile terminal body
30: Card (as in SIM card or the like)

DESCRIPTION OF EMBODIMENTS

The following describes the specific embodiments of the present application in detail with reference to the accompanying drawings. It should be understood that the specific embodiments described herein are merely used to explain the present application but are not intended to limit the present application.

FIG. 1 is a cross sectional view of a card tray according to an embodiment of the present application. The card tray 10 includes a card tray base 11, a first insulation layer 12 disposed on the card tray base 11, and a second insulation layer 13 covering the first insulation layer 12, where hardness of the first insulation layer 12 is higher than that of the second insulation layer 13.

In this embodiment, the two insulation layers 12 and 13 are disposed on the card tray base 11 to protect the card tray base 11, and hardness of the first insulation layer 12 is set to be higher than that of the second insulation layer 13. When burrs or sharp corners on a card pierce the second insulation layer 13, the second insulation layer 13 can sacrifice its own coating to consume some burrs or sharp corners on the card, and therefore, remaining burrs and sharp corners are reduced. When the remaining burrs or sharp corners continue to pierce the first insulation layer 12, integrity of an insulation coating of the first insulation layer 12 can be maintained to the greatest extent. The chance of electric conduction of the card tray 10 caused by the damage of the first insulation layer 12 can be reduced, so as to ensure a mobile terminal to recognize the card in the card tray.

To facilitate understanding of this embodiment of the present application, a structure of the card tray 10 provided by this embodiment of the present application is hereinafter described in detail with reference to accompanying drawings.

First, the card tray 10 provided by this embodiment is a tray for housing a SIM card, a tray for housing a secure digital memory (SD) card, or a tray for housing a card that is used for signal transmission, number identification, storage, and the like in a device. Such device can be, for example, a mobile phone, a smart watch, a smart band, a tablet computer, or a wearable device in any forms.

The card tray base 11 of the card tray 10 provided by this embodiment may be made of different materials. For example, a material of the card tray base 11 may be one of the following materials: a metal, a metal alloy, a metal-based composite, or an inorganic non-metal material. Specifically, the card tray 10 may be made of a stainless steel substrate, or may be made of other iron and steel materials, an aluminum alloy, a magnesium alloy, a titanium alloy, an amorphous alloy, a zinc alloy, a copper alloy, a metal base composite material, or the like, or may be made of ceramic or other inorganic non-metal substrates such as ceramics, glass, sapphire, nucleated glass, or spinel. The card tray base 11 may be made of different materials according to different requirements.

In a specific preparation, the first insulation layer 12 and the second insulation layer 13 are formed on the card tray base 11 in an area for placing a card. That is, the first insulation layer 12 and the second insulation layer 13 are formed on sidewalls of a card slot for housing the card on the card tray 10. In this way, when the card is placed in the card tray 10 and scratches the insulation layers on the card tray 10, the insulation layers protect the card tray base 11, so as to reduce the possibility that the mobile terminal cannot recognize card information due to electric conduction of the card tray 10. To achieve the foregoing effect, the insulation layers provided by this embodiment need to have particular thicknesses. Specifically, a thickness of the first insulation layer 12 is between 0.3 micrometer and 7 micrometers, and a thickness of the second insulation layer 13 is between 3 micrometers and 100 micrometers. The thickness of the first insulation layer 12 may be any thickness between 0.3 micrometer and 7 micrometers, such as 0.3 micrometer, 1 micrometer, 2 micrometers, 3 micrometers, 4 micrometers, 5 micrometers, 6 micrometers, or 7 micrometers. The thickness of the second insulation layer 13 may be any thickness between 3 micrometers and 100 micrometers, such as 3 micrometers, 10 micrometers, 20 micrometers, 30 micrometers, 40 micrometers, 50 micrometers, 60 micrometers, 70 micrometers, 80 micrometers, 90 micrometers, or 100 micrometers. In a solution, preferably, the thickness of the first insulation layer 12 is between 0.3 micrometer and 3 micrometers, and the thickness of the second insulation layer 13 is between 10 micrometers and 25 micrometers. For example, the thickness of the first insulation layer 12 is any thickness between 0.3 micrometer and 3 micrometers, such as 0.3 micrometer, 0.5 micrometer, 1 micrometer, 1.5 micrometers, 2 micrometers, 2.5 micrometers, or 3 micrometers, and the thickness of the second insulation layer 13 is any thickness between 10 micrometers and 25 micrometers, such as 10 micrometers, 15 micrometers, 20 micrometers, or 25 micrometers.

In addition, during preparation of the insulation layers on the card tray base 11, hardness of the first insulation layer 12 is higher than that of the second insulation layer 13. For example, pencil hardness of the first insulation layer 12 is generally far higher than 9H, and pencil hardness of the second insulation layer 13 is approximately 3H, so that the first insulation layer 12 can effectively prevent the card tray 10 from being scratched by the card.

Figure 2:
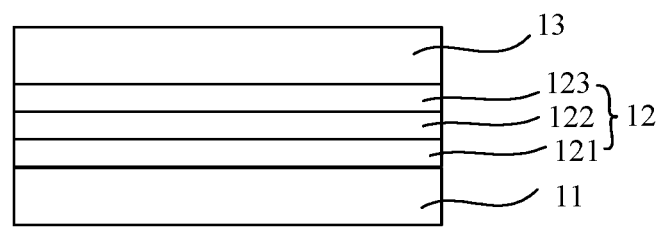
FIG. 2 is a further cross sectional view of a first insulation layer in a card tray according to an embodiment of the present application.

FIG. 2 shows a structure of the first insulation layer 12 in the structure of the card tray 10. In a specific preparation, the first insulation layer 12 includes an insulation coating 123 which includes a diamond-like carbon material, for example, a diamond-like carbon (DLC) film having a relatively high hardness. The DLC material ensures that hardness of the first insulation layer 12 is far higher than that of the second insulation layer 13. The first insulation layer 12 includes at least three layers. That is, a metal base layer 121 disposed on the card tray base 11, an intermediate layer 122 disposed on the metal base layer 121, and the insulation coating 123 disposed on the intermediate layer 122. The intermediate layer 122 is a mixed layer of a metal and a chemical compound of the metal. The insulation coating 123 is a mixed layer of a metal, a chemical compound of the metal, and a diamond-like carbon material.

During preparation of the intermediate layer 122, the chemical compound of the metal in the mixed layer of the metal and the chemical compound of the metal may be a metal oxide, a metal nitride, a metal carbide, a metal sulfide, a metal boride coating, a metal oxynitride, a metal carbonitride, or a metal carbon oxynitride. A ratio of a pure metal to a chemical compound of the metal may not be limited, and may be adjusted. A percentage of weight of the chemical compound may be from 0% to 100%, adjustable from 0%. A percentage of weight of the pure metal may be from 100% to 0%, adjustable from 100%. Specifically, starting from one side that is of the intermediate layer 122 and that faces the metal base layer 121, in a direction away from the metal base layer 121, content of the pure metal decreases gradually, and content of the chemical compound of the metal increases gradually. The two take on a corresponding gradual change. That is, one side that is of the intermediate layer 122 and that face the metal base layer 121 is the pure metal, and one side that faces the insulation coating 123 is the chemical compound of the metal.

During preparation of the insulation coating 123, the insulation coating 123 may be a mixed coating using the material of the intermediate layer 122 and the DLC (that is, the metal, the chemical compound of the metal, and the DLC material), or may be a mixed coating using only the chemical compound of the metal in the second metal layer and the DLC material. In addition, a ratio of the DLC to the mixed coating may not be limited, and may be adjusted. A percentage of weight of the DLC may be from 0% to 100%, and may be adjusted from 0% until 100%. A percentage of weight of the chemical compound of the metal may be from 100% to 0%, and may be adjusted from 100% until 0%. That is, in the insulation coating 123, content of the metal and the chemical compound of the metal is higher in a position closer to the intermediate layer 122; and content of the diamond-like carbon material is higher in a position farther away from the intermediate layer 122. In addition, in the formed insulation coating 123, one side that is of the insulation coating 123 and that faces the intermediate layer 122 is a layer of the chemical compound of the metal, and one side far away from the intermediate layer 122 is a pure DLC film.

The first insulation layer 12 provided by this embodiment uses a DLC film. Although the DLC may not be scratched easily, sharp corners and burrs of the SIM card may pierce the DLC film under pressure of a human hand. Therefore, on the card tray 10 provided by this embodiment, the second insulation layer 13 is added on the first insulation layer 12. The second insulation layer 13 is a polymer coating. Specifically, the second insulation layer 13 includes at least one of the following: a polytetrafluoroethylene coating, a paint coating, or an ink coating. In addition, the second insulation layer may be any polymer coating or a coating having a mixture of polymers and other inorganic materials, or may be coatings complexly superimposed on the foregoing coating. When a mixed layer is used, a ratio of various components is not limited, and any ratio may be used for the mixing. After the coatings are applied, high-temperature processing is required. Generally, polytetrafluoroethylene is processed at a high temperature of 160° C. to 320° C. for duration of 15 minutes to 60 minutes; ordinary ink or paint is processed at a temperature of 50° C. to 200° C. for duration of 15 minutes to 120 minutes. The foregoing coatings may be complexly superimposed, and after each coating is sprayed, corresponding baking processing needs to be performed. For example, single spraying and single baking, that is, spraying once, and baking once; or double spraying and double baking, that is, spraying once, and baking once, and then spraying once again, and baking once again; or more coatings are superimposed.

As can be learned from the foregoing description, the card tray 10 provided by this embodiment uses two insulation layers of different hardness. This can effectively prevent the insulation layers on the card tray 10 from being scratched by sharp corners or burrs on a card, improve insulating properties of the card tray 10, and avoid a case in which a mobile terminal cannot recognize card information because the card tray 10 is scratched by the card.

An embodiment of the present application further provides a method for preparing a card tray 10. The method includes:

forming a first insulation layer on a card tray base; and forming a second insulation layer on the formed first insulation layer, where hardness of the formed first insulation layer is higher than that of the second insulation layer.

In this embodiment, two insulation layers of different hardness are formed on a card tray 10. This effectively prevents the insulation layers on the card tray 10 from being scratched by sharp corners or burrs on a card, improves insulating properties of the card tray 10, and avoids a case in which a mobile terminal cannot recognize card information because the card tray 10 is scratched by the card.

To facilitate understanding of the method for preparing the card tray 10 provided by this embodiment of the present application, the method is hereinafter described in details.

Figure 3:
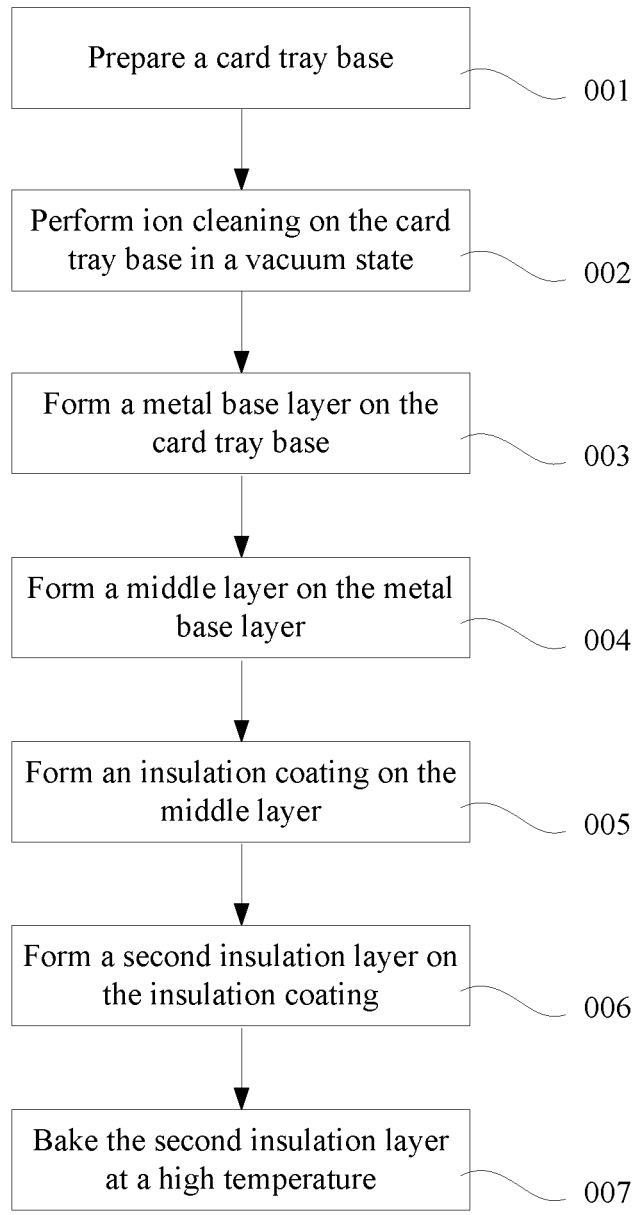
FIG. 3 is a flowchart of a method for preparing a card tray according to an embodiment of the present application.

FIG. 3 is a flowchart of a method for preparing a card tray according to an embodiment of the present application. The card tray is the card tray in the foregoing specific embodiment. The specific method for preparing the card tray includes the following steps.

Step 001: Prepare a card tray base.

Specifically, the card tray may be made of different materials. For example, the card tray base can be made of a metal material, a metal alloy material, a metal-based composite material, or an inorganic non-metal material. Specifically, the card tray is made of a stainless steel substrate, or may be made of other iron and steel materials, an aluminum alloy, a magnesium alloy, a titanium alloy, an amorphous alloy, a zinc alloy, a copper alloy, a metal-based composite material, or the like, or may be made of ceramic or other inorganic non-metal substrates such as ceramics, glass, sapphire, nucleated glass, or spinel. Different preparation methods may be selected according to different materials used for the card tray. For example, the card tray is formed by using different processes such as metal injection molding, vacuum die casting, and ordinary die casting. The foregoing processes are mature processes, and are not described in detail herein.

Step 002: ion cleaning on the card tray base in a vacuum state.

Specifically, surfaces of the card tray base is deoiled, degreased, and cleaned by using pure water in ultrasonic waves, and then the card tray base is baked and loaded onto a related fixture to enter a physical vapor deposition (PVD) furnace chamber. In addition, ion cleaning is performed according to a specified vacuum degree condition and a negative bias voltage condition.

Step 003: Form a metal base layer on the card tray base.

Specifically, the metal base layer is made of a metal material that can be combined with the card tray base. The metal of the metal base layer should be capable of attaching to the card tray base properly. During specific preparation of the metal base layer, processes such as electroplating, PVD, and chemical vapor deposition (CVD) may be used. The processes are mature processes, and are not described in detail herein.

Step 004: Form an intermediate layer on the metal base layer.

Specifically, the intermediate layer includes a metal and a chemical compound of the metal. The chemical compound of the metal in a mixture of the metal and the chemical compound of the metal may be a metal oxide, a metal nitride, a metal carbide, a metal sulfide, a metal boride coating, a metal oxynitride, a metal carbonitride, or a metal carbon oxynitride. A ratio of a pure metal to a chemical compound may not be limited, and may be adjusted. A percentage of weight of the chemical compound may be from 0% to 100%, adjustable from 0%. A percentage of weight of the pure metal may be from 100% to 0%, adjustable from 100%. Specifically, as a thickness of the intermediate layer increases, content of the metal in the intermediate layer decreases gradually, and as the thickness of the intermediate layer increases, content of the chemical compound of the metal in the intermediate layer increases gradually. The metal and the chemical compound of the metal take on a corresponding gradual change. That is, one side that is of the intermediate layer and that faces the metal base layer is the pure metal, and one side that faces an insulation coating is the chemical compound of the metal. During specific preparation of the intermediate layer, processes such as electroplating, PVD, and CVD may be used. The processes are mature processes, and are not described in detail herein.

Step 005: Form an insulation coating on the intermediate layer.

Specifically, the insulation coating may be a mixed coating using the material of the intermediate layer and DLC (that is, the metal, the chemical compound of the metal, and a DLC material), or may be a mixed coating using only the chemical compound of the metal in the second metal layer and a DLC material. In addition, a ratio of the DLC to the mixed coating may not be limited, and may be adjusted. A percentage of weight of the DLC may be from 0% to 100%, and may be adjusted from 0% until 100%. A percentage of weight of the chemical compound of the metal may be from 100% to 0%, and may be adjusted from 100% until 0%. That is, as a thickness of the insulation coating increases, content of the metal and the chemical compound of the metal in the insulation coating decreases gradually, and as the thickness of the insulation coating increases, content of a diamond-like carbon film in the insulation coating increases gradually. In addition, in the formed insulation coating, one side that is of the insulation coating and that faces the intermediate layer is a layer of the chemical compound of the metal, and one side far away from the intermediate layer is a pure DLC film. During specific preparation of the insulation coating, processes such as electroplating, PVD, and CVD may be used. The processes are mature processes, and are not described in detail herein. The formed metal base layer, intermediate layer, and insulation coating constitute a first insulation layer, and a thickness of the formed first insulation layer is between 0.3 micrometer and 7 micrometers.

Step 006: Form a second insulation layer on the insulation coating.

Specifically, a thickness of the formed second insulation layer is between 3 micrometers and 100 micrometers. During specific preparation, the second insulation layer is a polymer coating. For example, the second insulation layer is a polytetrafluorethylene coating, a paint coating, or an ink coating, or may be any polymer coating or a coating having a mixture of polymers and other inorganic materials, or may be coatings complexly superimposed on the foregoing coating. In addition, when a mixed layer is used, a ratio of various components is not limited, and any ratio may be used for mixing. During specific preparation, the method for preparing the second insulation layer is not limited, and any coating manner may be used for implementation.

Step 007: Bake the second insulation layer at a high temperature.

Specifically, when the second insulation layer is prepared in the manner described in step 006, after the coatings are processed, high-temperature processing is required. Generally, polytetrafluoroethylene is processed at a high temperature of 160° C. to 320° C. for duration of 15 minutes to 60 minutes; ordinary ink or paint is processed at a temperature of 50° C. to 200° C. for duration of 15 minutes to 120 minutes. The foregoing coatings may be complexly superimposed, and after each coating is sprayed, corresponding baking processing needs to be performed. For example, single spraying and single baking, that is, spraying once, and baking once; or double spraying and double baking, that is, spraying once, and baking once, and then spraying once again, and baking once again; or more coatings are superimposed.

For further understanding the method for preparing a card tray provided by this embodiment of the present application, the following examples are provided.

Example 1

In this example, a card tray for a nano SIM card is prepared. A material of a card tray base is a type 17-4 stainless steel. A specific method for preparing the card tray is as follows:

Step 1: Form a card tray base by means of a metal injection molding process.

Step 2: Prepare a DLC film in a specified area on the formed card tray base.

Specific steps of the method are as follows:

(A) Deoil and degrease a surface of the stainless steel card tray base, clean the surface by using pure water in ultrasonic waves, then bake the card tray base, and load the card tray base onto a related fixture to enter a PVD furnace chamber.

(B) A magnetron sputtering target is used in this example, vacuumize the PVD furnace chamber, where a vacuum degree is better than $6.5 \times 10^{-3}$ Pa; then inject argon, keep the vacuum degree between 0.1 Pa and 1 Pa, turn on a negative bias voltage −800 V, and perform ion cleaning on the stainless steel card tray base.

(C) Turn on nitrogen, turn on the magnetron sputtering titanium target, first deposit a pure Ti layer (metal base layer) for combining with the stainless steel base, and then prepare a mixed layer (intermediate layer) of TiN and Ti by adjusting a titanium target power and a gas-flow rate; then turn on a graphite target, inject acetylene, gradually reduce the nitrogen gas-flow rate and the titanium target power to 0, and prepare a mixed layer of TiN, TiC, and DLC; then with only the graphite target, acetylene, and argon remaining, prepare a pure DLC film. A total thickness of the PVD film is 2.8 micrometers.

(D) Spray a polytetrafluorethylene coating on the DLC film, bake at 260° C. for 20 minutes after spraying for the first time, and bake at 260° C. for 20 minutes after spraying for the second time, where a total thickness is 25 micrometers.

In a test, a multimeter is used to measure surface resistance on the DLC, and the surface resistance is greater than 20 MΩ (20 million ohms). After polytetrafluorethylene is sprayed, the surface resistance may be greater than 20 million ohms. After a micro SIM card is cut down to a nano SIM card, the nano SIM card is put on the card tray in a card slot of a real mobile phone, and an insertion and removal test is performed. The test is repeated cyclically. After 60 repeats, the mobile phone can still recognize the SIM card, and signal quality is good.

Example 2

In this example, a card tray for a nano SIM card is prepared. The card tray base is made of an amorphous alloy material. A specific method for preparing the card tray is as follows:

(A) Form a card tray base by using a vacuum die casting method.

(B) Prepare a DLC film in a specified area on the card tray base.

The specific preparation method is as follows:

Step 1: Deoil and degrease a surface of the card tray base, clean the surface by using pure water in ultrasonic waves, then bake the card tray base, and load the card tray base onto a related fixture to enter a PVD furnace chamber.

Step 2: A magnetron sputtering target is used in this example, vacuumize the PVD furnace chamber, where a vacuum degree is better than $6 \times 10^{-3}$ Pa; then inject argon, keep the vacuum degree between 0.1 Pa and 0.8 Pa, turn on a negative bias voltage of −700 V, and perform ion cleaning on the card tray base.

Step 3: Turn on acetylene, turn on a magnetron sputtering chromium target, and first deposit a pure chromium layer for combining with the substrate; then prepare a mixed layer of CrC and Cr by adjusting a chromium target power and a gas-flow rate; then turn on a graphite target, gradually reduce the chromium target power to 0, and prepare a mixed layer of CrC and DLC; then with only the graphite target, acetylene, and argon remaining, prepare a pure DLC film. A total thickness of the PVD film is 2.6 micrometers.

Step 4: Spray a polytetrafluorethylene coating having a thickness of 22 micrometers on the DLC film, bake at 160° C. for 30 minutes after spraying for the first time, and bake at 160° C. for 30 minutes after spraying for the second time.

In a test, a multimeter is used to measure surface resistance on the DLC, and the surface resistance is greater than 2 MSΩ (2 million ohms). After polytetrafluorethylene is sprayed, the surface resistance may be greater than 20 million ohms. After a micro SIM card is cut down to a nano SIM card, the nano SIM card is put on the card tray in a card slot of a real mobile phone, and an insertion and removal test is performed. The test is repeated cyclically. After 46 repeats, the mobile phone can still recognize the SIM card, and signal quality is good.

Example 3

In this example, a card tray for a nano SIM card is prepared. The card tray base is made of a zinc alloy material. A specific method for preparing the card tray is as follows:

(A) Form a card tray base by using an ordinary die casting method.

(B) Prepare a DLC film in a specified area on the card tray base.

The specific method for preparing the card tray is as follows:

Step 1: Deoil and degrease a surface of the card tray base, clean the surface by using pure water in ultrasonic waves, then bake the card tray base, and load the card tray base onto a related fixture to enter a PVD furnace chamber.

Step 2: A magnetron sputtering target is used in this example, vacuumize the PVD furnace chamber, where a vacuum degree is better than $5 \times 10^{-3}$ Pa; then inject argon, keep the vacuum degree between 0.3 Pa and 0.8 Pa, turn on a negative bias voltage of −500 V, and perform ion cleaning on the card tray base.

Step 3: Turn on acetylene, turn on a magnetron sputtering tungsten target, first deposit a pure tungsten layer for combining with the substrate, and then prepare a mixed layer of WC and W by adjusting a tungsten target power and a gas-flow rate; then turn on a graphite target, gradually reduce the W target power to 0, and prepare a mixed layer of WC and DLC; then with only the graphite target, acetylene, and argon remaining, prepare a pure DLC film, where a total thickness of the PVD film is 2.9 micrometers.

Step 4: Spray a polytetrafluorethylene coating having a thickness of 20 micrometers on the DLC film; after spraying, bake at 320° C. for 30 minutes.

In a test, a multimeter is used to measure surface resistance on the DLC, and the surface resistance is greater than 2 MΩ (2 million ohms). After polytetrafluorethylene is sprayed, the surface resistance may be greater than 20 million ohms. After a micro SIM card is cut down to a nano SIM card, the nano SIM card is put on the card tray in a card slot of a real mobile phone, and an insertion and removal test is performed. The test is repeated cyclically. After 52 repeats, the mobile phone can still recognize the SIM card, and signal quality is good.

Example 4

In this example, a card tray for a macro SIM card is prepared. The card tray base is made of a type-316 stainless steel material. A specific method for preparing the card tray is as follows:

(A) Form a card tray base by means of metal injection molding.

(B) Prepare a DLC film in a specified area on the card tray base.

Specific steps of the method are as follows:

Step 1: Deoil and degrease a surface of the card tray base, clean the surface by using pure water in ultrasonic waves, then bake the card tray base, and load the card tray base onto a related fixture to enter a PVD furnace chamber.

Step 2: Assuming that an arc ion plating target is used in this embodiment, vacuumize the PVD furnace chamber, where a vacuum degree is better than $6.5 \times 10^{-3}$ Pa; then inject argon, keep the vacuum degree between 0.4 Pa and 0.9 Pa, turn on a negative bias voltage of –800 V, and perform ion cleaning on the card tray base.

Step 3: Turn on oxygen, turn on an aluminum target, and first deposit a pure aluminum layer for combining with the substrate; then prepare a mixed layer of an aluminum oxide and aluminum by adjusting an aluminum target power and a gas-flow rate; then turn on a graphite target, gradually reduce the aluminum target power to 0, reduce the oxygen gas-flow rate to 0, and prepare a mixed layer of an aluminum oxide and DLC; then with only the graphite target, acetylene, and argon remaining, prepare a pure DLC film. A total thickness of the PVD film is 2.5 micrometers.

Step 4: Spray an ordinary paint coating having a thickness of 15 micrometers on the DLC film; after spraying, bake at 80° C. for 40 minutes.

In a test, a multimeter is used to measure surface resistance on the DLC, and the surface resistance is greater than 2 MΩ (2 million ohms). After polytetrafluorethylene is sprayed, the surface resistance may be greater than 20 million ohms. After a micro SIM card is cut down to a nano SIM card, the nano SIM card is put on the card tray in a card slot of a real mobile phone, and an insertion and removal test is performed. The test is repeated cyclically. After 45 repeats, the mobile phone can still recognize the SIM card, and signal quality is good.

Example 5

In this example, a card tray for a nano SIM card is prepared. The card tray base is made of an amorphous alloy. A specific method for preparing the card tray is as follows:

(A) Prepare a card tray base by using a vacuum die casting method.

(B) Prepare a DLC film in a specified area on the card tray base.

Specific steps of the method are as follows:

Step 1: Deoil and degrease a surface of the card tray base, clean the surface by using pure water in ultrasonic waves, then bake the card tray base, and load the card tray base onto a related fixture to enter a PVD furnace chamber.

Step 2: An arc ion plating target is used in this example, vacuumize the PVD furnace chamber, where a vacuum degree is better than $6.5 \times 10^{-3}$ Pa; then inject argon, keep the vacuum degree between 0.4 Pa and 0.9 Pa, turn on a negative bias voltage of –800 V, and perform ion cleaning on the card tray base.

Step 3: Turn on nitrogen, turn on a titanium target, and first deposit a pure titanium layer for combining with the substrate; then prepare a mixed layer of TiN and Ti by adjusting a titanium target power and a gas-flow rate; then turn on a graphite target, gradually reduce the titanium target power to 0, reduce the nitrogen gas-flow rate to 0, and prepare a mixed layer of a titanium nitride and DLC; then with only the graphite target, acetylene, and argon remaining, prepare a pure DLC film. A total thickness of the PVD film is 3 micrometers.

Step 4: Print ordinary ink having a thickness of 26 micrometers on the DLC film; after printing, bake at 80° C. for 40 minutes.

In a test, a multimeter is used to measure surface resistance on the DLC, and the surface resistance is greater than 2 MΩ (2 million ohms). After polytetrafluorethylene is sprayed, the surface resistance may be greater than 20 million ohms. After a micro SIM card is cut down to a nano SIM card, the nano SIM card is put on the card tray in a card slot of a real mobile phone, and an insertion and removal test is performed. The test is repeated cyclically. After 50 repeats, the mobile phone can still recognize the SIM card, and signal quality is good.

Example 6

In this example, a card tray for a nano SIM card is used prepared. The card tray base is made of type 17-4 stainless steel. A specific method for preparing the card tray is as follows:

Step 1: Form a card tray base by means of a metal injection molding process.

Step 2: Prepare a DLC film in a specified area on the formed card tray base.

Specific steps of the method are as follows:

(A) Deoil and degrease a surface of the stainless steel card tray base, clean the surface by using pure water in ultrasonic waves, then bake the card tray base, and load the card tray base onto a related fixture to enter a PVD furnace chamber.

(B) A magnetron sputtering target is used in this example, vacuumize the PVD furnace chamber, where a vacuum degree is better than $6.5 \times 10^{-3}$ Pa; then inject argon, keep the vacuum degree between 0.1 Pa and 1 Pa, turn on a negative bias voltage –600 V, and perform ion cleaning on the stainless steel card tray base.

(C) Turn on a magnetron sputtering Ti target, first deposit a pure Ti layer (metal base layer) for combining with the stainless steel base, and then prepare a mixed layer (intermediate layer) of WC and Ti by adjusting a tungsten carbide target power and a gas-flow rate; then turn on a graphite target, gradually reduce a nitrogen gas-flow rate and the titanium target power to 0, inject acetylene and continuously increase a gas-flow rate, and obtain a mixed layer of WC and DLC. A total thickness of the PVD film is 3.2 micrometers.

(D) Spray a polytetrafluorethylene coating on the DLC film, bake at 160° C. for 30 minutes after spraying for the first time, and bake at 160° C. for 30 minutes after spraying for the second time, where a total thickness is 28 micrometers.

In a test, a multimeter is used to measure surface resistance on the DLC, and the surface resistance is greater than 2 MΩ (2 million ohms). After polytetrafluorethylene is sprayed, the surface resistance may be greater than 20 million ohms. After a micro SIM card is cut down to a nano SIM card, the nano SIM card is put on the card tray in a card slot of a real mobile phone, and an insertion and removal test is performed. The test is repeated cyclically. After 60 repeats, the mobile phone can still recognize the SIM card, and signal quality is good.

Figure 4:
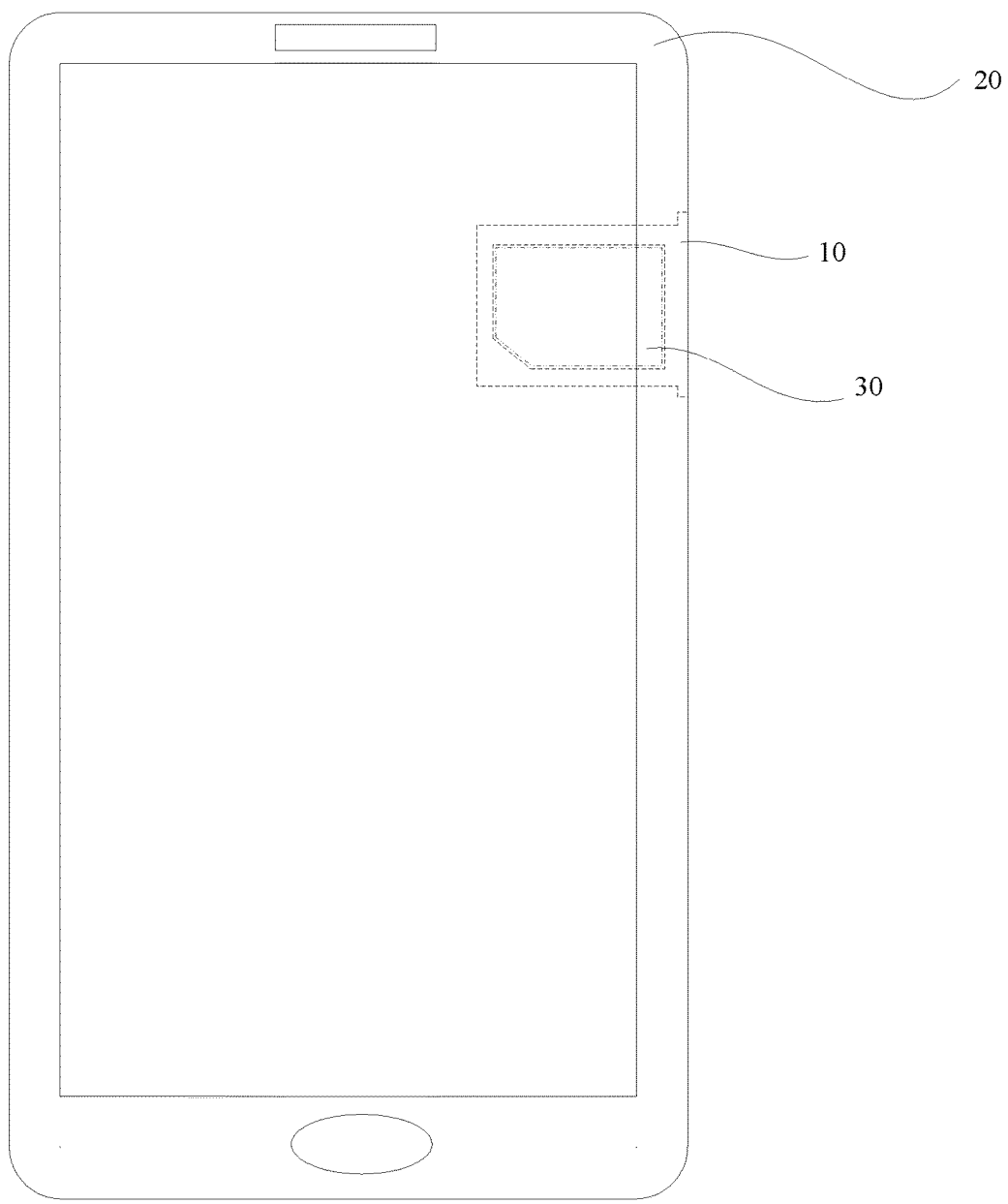
FIG. 4 is a schematic structural diagram of a mobile terminal with a card tray according to an embodiment of the present application.

FIG. 4 is a schematic structural diagram of a mobile terminal according to an embodiment of the present application.

The mobile terminal includes a mobile terminal body 20, a card tray 10 mounted inside the mobile terminal body 20, and a card 30 clamped into the card tray 10. The card tray 10 is any one of the foregoing card trays 10.

In this embodiment, two insulation layers are disposed on a card tray base to protect the card tray base, and hardness of a first insulation layer is set to be higher than that of a second insulation layer. When burrs or sharp parts on a card pierce the second insulation layer, the first insulation layer can block the burrs or the sharp parts, thereby preventing an insulation coating on the card tray base from being scratched by the burrs. Therefore, insulating properties of a card tray 10 are improved effectively, and therefore, an effect of recognizing the card by the mobile terminal is improved. Cases in which the mobile terminal cannot recognize the card due to scratches on the insulation coating of the card tray 10 and electric conduction of the card tray 10 are reduced effectively.

Obviously, a person skilled in the art can make various modifications and variations to the present application without departing from the scope of the present application. The present application is intended to cover these modifications and variations provided that they fall within the scope of protection defined by the following claims and their equivalent technologies.

What is claimed is:

1. A card tray, comprising:
    a card tray base having a card slot for housing a card, wherein the card tray base is made of a conductive material,
    a first insulation layer disposed on sidewalls of the card slot of the card tray base, and
    a second insulation layer disposed on the first insulation layer,
wherein hardness of the first insulation layer is higher than hardness of the second insulation layer.

2. The card tray according to claim 1, wherein the first insulation layer is an insulation coating comprising a diamond-like carbon material.

3. The card tray according to claim 1, wherein the first insulation layer comprises a metallic base layer disposed on the sidewalls of the card slot of the card tray base, an intermediate layer disposed on the metallic base layer, and an insulation coating disposed on the intermediate layer, wherein the intermediate layer is a mixed layer of a metal and a chemical compound of the metal, and the insulation coating is a mixed layer of the metal, the chemical compound of the metal, and a diamond-like carbon material.

4. The card tray according to claim 3, wherein in the insulation coating, content of the metal and the chemical compound of the metal is higher in a position closer to the intermediate layer, and content of the diamond-like carbon material is higher in a position farther away from the intermediate layer.

5. The card tray according to claim 3, wherein the chemical compound of the metal in the intermediate layer and the insulation coating is a metal oxide, a metal nitride, a metal carbide, a metal sulfide, a metal boride, a metal oxynitride, a metal carbonitride, or a metal carbon oxynitride.

6. The card tray according to claim 1, wherein the card tray base is made of one of the following:
    a metal material, a metal alloy material, a metal base composite material, and an inorganic non-metal material.

7. The card tray according to claim 1, wherein a thickness of the first insulation layer is between 0.3 micrometer and 7 micrometers.

8. The card tray according to claim 7, wherein a thickness of the second insulation layer is between 3 micrometers and 100 micrometers.

9. The card tray according to claim 1, wherein a thickness of the first insulation layer is between 0.3 micrometer and 3 micrometers.

10. The card tray according to claim 9, wherein a thickness of the second insulation layer is between 10 micrometers and 25 micrometers.

11. The card tray according to claim 1, wherein the second insulation layer is a polymer coating.

12. The card tray according to claim 11, wherein the polymer coating is one of the following:
    a polytetrafluorethylene coating, a paint coating, and an ink coating.

13. A method for making a card tray of a mobile terminal, wherein the card tray has a card slot formed on a card tray base, and the card tray base is made of a conductive material, the method comprising:
    forming a first insulation layer on sidewalls of the card slot; and
    forming a second insulation layer on the formed first insulation layer,
    wherein hardness of the first insulation layer is higher than hardness of the second insulation layer.

14. The method according to claim 13, wherein forming the first insulation layer on the sidewalls of the card slot comprises:
    forming a metallic base layer on the sidewalls of the card slot;
    forming an intermediate layer on the metallic base layer; and
    forming an insulation coating on the intermediate layer,
    wherein the intermediate layer is a mixed layer of a metal and a chemical compound of the metal, and the insulation coating is a mixed layer of the metal, the chemical compound of the metal, and a diamond-like carbon material.

15. The method according to claim 14, wherein the intermediate layer is formed by a physical vapor deposition process, and forming the intermediate layer comprises:
    as a thickness of the intermediate layer increases, decreasing content of the metal in the intermediate layer gradually, and increasing content of the chemical compound of the metal in the intermediate layer gradually.

16. The method according to claim 15, wherein the insulation coating is formed by a physical vapor deposition process, and forming the insulation coating comprises:
   as a thickness of the insulation coating increases, decreasing content of the metal and the chemical compound of the metal in the insulation coating gradually, and increasing content of the diamond-like carbon material in the insulation coating gradually, until a diamond-like carbon film is formed.

17. The method according to claim 13, further comprising:
   before forming the first insulation layer on the card tray base, performing ion cleaning on the card tray base under vacuum.

18. The method according to claim 17, further comprising:
   after forming the second insulation layer on the first insulation layer, baking the card tray at an elevated temperature.

19. The method according to claim 17, wherein a thickness of the formed first insulation layer is between 0.3 micrometer and 7 micrometers, and a thickness of the formed second insulation layer is between 3 micrometers and 100 micrometers.

20. A mobile terminal, comprising a mobile terminal body and a card tray mounted at least partially inside the mobile terminal body for holding a card, wherein the card tray comprises:
   a card tray base having a card slot for housing the card, wherein the card tray base is made of a conductive material;
   a first insulation layer disposed on the sidewalls of the card slot of the card tray base; and
   a second insulation layer disposed on the first insulation layer, wherein hardness of the first insulation layer is higher than hardness of the second insulation layer.

* * * * *